United States Patent
Braz et al.

(10) Patent No.: US 10,707,767 B2
(45) Date of Patent: Jul. 7, 2020

(54) TWO-LEVEL SWITCH DRIVER FOR PREVENTING AVALANCHE BREAKDOWN FOR A SYNCHRONOUS RECTIFICATION SWITCH IN A POWER CONVERTER OPERATING IN A LOW-POWER BURST MODE

(71) Applicant: Infineon Technologies Austria AG, Villach (AT)

(72) Inventors: Cesar Augusto Braz, Villach (AT); Roberto Quaglino, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/209,102

(22) Filed: Dec. 4, 2018

(65) Prior Publication Data
US 2020/0177090 A1    Jun. 4, 2020

(51) Int. Cl.
*H02M 1/08*         (2006.01)
*H02M 3/335*        (2006.01)
(Continued)

(52) U.S. Cl.
CPC ......... *H02M 3/33592* (2013.01); *H02M 1/08* (2013.01); *H02M 1/42* (2013.01); *H02M 2001/0035* (2013.01)

(58) Field of Classification Search
CPC .... H03K 17/161; H03K 17/302; H03K 17/56; H03K 17/567; H03K 17/60; H03K 17/687; H03K 17/6871; H03K 17/16; H03K 17/30; H03K 17/601; H03K 17/64; H03K 17/691; H03K 17/731; H03K 17/10;
(Continued)

(56) References Cited

U.S. PATENT DOCUMENTS

2011/0122659 A1*  5/2011  Duan ................ H02M 3/33507
                                              363/21.16
2015/0249380 A1   9/2015  Hayakawa et al.
(Continued)

OTHER PUBLICATIONS

"Some key facts about avalanche", Infineon Technologies AG, AN_201611_PL11_002, Version 1.0, Jan. 9, 2017.
(Continued)

*Primary Examiner* — Bryan R Perez
(74) *Attorney, Agent, or Firm* — Murphy, Bilak & Homiller, PLLC

(57) ABSTRACT

Techniques are provided for avoiding an avalanche breakdown voltage across a synchronous rectification (SR) switch on the secondary side of an isolated switched-mode power converter operating in a low-power mode, e.g., a burst mode, during which a load of the power converter draws negligible current. This is accomplished via use of a two-level switch driver for controlling a power switch on the primary side of the power converter. The two-level switch driver is configured to source low current levels to a control terminal (e.g., gate) of the power switch during burst-mode operation. This low current reduces the slope of the rising edge of voltage pulses on the primary and secondary sides of the power converter which, in turn, limits the peak of the voltage ringing across the SR switch. By limiting the voltage in this manner, the SR switch avoids entering avalanche breakdown.

20 Claims, 5 Drawing Sheets

(51) Int. Cl.
*H02M 1/42* (2007.01)
*H02M 1/00* (2006.01)
(58) Field of Classification Search
CPC .... H03K 17/102; H03K 17/107; H03K 17/12; H03K 17/122; H03K 17/127; H02M 3/33538; H02M 3/33546; H02M 3/33515; H02M 3/33576; H02M 3/33553; H02M 3/33507; H02M 3/33592; H02M 3/33523; H02M 3/3353; H02M 3/33569; H02M 1/42; H02M 1/08; H02M 2001/0035
See application file for complete search history.

(56) References Cited

U.S. PATENT DOCUMENTS

| | | | | |
|---|---|---|---|---|
| 2015/0280576 | A1* | 10/2015 | Hinz | H02M 3/33507 363/21.15 |
| 2015/0381056 | A1 | 12/2015 | Hayakawa et al. | |
| 2016/0172962 | A1 | 6/2016 | Chen et al. | |
| 2016/0329819 | A1* | 11/2016 | Chen | H02M 3/33515 |
| 2016/0380527 | A1 | 12/2016 | Hayakawa et al. | |
| 2017/0302151 | A1* | 10/2017 | Snook | H02M 1/08 |
| 2019/0097624 | A1* | 3/2019 | Nagl | H03K 17/302 |

OTHER PUBLICATIONS

Medina Garcia, Alfredo, et al., "Asymmetrical flyback converter in high density SMPS", PCIM Europe 2018; International Exhibition and Conference for Power Electronics, Intelligent Motion, Renewable Energy and Energy Management, Jun. 2018.

\* cited by examiner

TWO-LEVEL SWITCH DRIVER FOR PREVENTING AVALANCHE BREAKDOWN FOR A SYNCHRONOUS RECTIFICATION SWITCH IN A POWER CONVERTER OPERATING IN A LOW-POWER BURST MODE

TECHNICAL FIELD

The present application relates to a switched-mode power converter in which a power switch is controlled by a driver having two strength levels, wherein the driver limits the rate at which the power switch is turned on so as to prevent the voltage across a synchronous rectification (SR) switch from reaching an avalanche breakdown level.

BACKGROUND

Mobile consumer devices, such as smartphones, tablets and notebook computers, continue to grow in functionality and popularity. Such devices are typically battery-powered and require chargers for charging the device batteries from a mains supply. The battery chargers are preferably small and inexpensive. Due in part to their small size, the battery chargers must be efficient so that the heat generated within them does not cause excessive case temperatures. While an individual charger draws relatively little power, the vast number of such chargers connected to a power grid potentially leads to a significant load on the power grid. Hence, regulatory agencies have developed stringent requirements for the power efficiency of battery chargers during both active and standby operational modes, so as to limit the energy wasted by such chargers. To meet these size and efficiency goals, modern battery chargers increasingly use isolated switched-mode power converters. High switching speeds used by such converters enable the transformers within the converters to be relatively small and lightweight, especially as compared with prior-generation power converters that relied on a large transformer to directly step down the alternating current (AC) mains voltage prior to rectification.

Many modern battery chargers rely upon a flyback converter topology, and variants thereof, for converting a direct current (DC) high voltage, which has been rectified from an AC mains voltage, into the low voltage needed for charging a battery. Power switches convert the high DC voltage into a high-frequency AC voltage which is applied to the primary side of a transformer. An AC voltage induced on the secondary side of the transformer must be rectified to provide the DC voltage required by a load of the converter, e.g., a battery being charged. Such rectification relies upon current-blocking devices such as diodes and/or synchronous rectification (SR) switches. SR switches are preferred for rectification in most applications, including typical battery chargers, due to their lower power losses and lower associated heat, as compared with diodes.

In addition to providing efficient power transfer while they are in active use, e.g., charging a battery, switching power converters preferably draw minimal power when there is no load attached to them. For example, consumers often leave battery chargers connected to a mains supply even after the device being charged has been removed and/or after a battery is fully charged. To minimize power loss during such standby periods, power converters often resort to a burst mode of operation. During burst-mode operation, switching of the power switches is suspended for relatively long intervals of time. Once the output voltage has decreased to a minimum allowed standby-mode voltage level during an idle interval, the switching is enabled and the output voltage is boosted to a desired maximum standby-mode voltage during a burst interval. Note that even during standby mode, leakage current drains charge from the output capacitor, necessitating occasional recharging of the capacitor through, e.g., burst-mode operation.

Burst-mode operation potentially creates a problem in that the voltage across a secondary-side rectification device, such as an SR switch, reaches much higher levels than during normal operation. Because the load (e.g., a battery) is drawing no (or negligible) current during standby/burst-mode operation, the sharp rising voltage edge of each voltage pulse on the secondary side of the transformer generates more extreme ringing of the voltage across the SR switch than occurs during normal operational modes. The upper voltage excursion may exceed a maximum allowed voltage for the SR switch. Violation of such a maximum voltage may occur repeatedly during burst-mode operation, and may damage the rectification device.

Circuits and methods are desired to limit the maximum voltage occurring across a rectification device in a switched-mode power converter during burst-mode operation. Such circuits and methods should require minimal additional circuit components, and should be power efficient.

SUMMARY

According to an embodiment of a switch driver, the switch driver is configured to control a power switch in a switched-mode power converter, so as to prevent excessive voltage levels across a synchronous rectification (SR) switch of the power converter. The switch driver comprises a pull-down driver switch, two pull-up driver switches, a mode indication input, a switch control input, and a high-side control circuit. The pull-down driver switch sinks current from a control terminal of the power switch. The pull-up driver switches source current to the control terminal. A first of the pull-up switches has a first on-state resistance, and a second has a second on-state resistance, wherein the second on-state resistance is substantially higher than the first on-state resistance. The mode indication input indicates whether the power converter is operating in a burst mode or not. The switch control input controls the conductivity of the pull-down driver switch, the second (high resistance) pull-up driver switch and, in conjunction with the mode indication input, the first pull-up driver switch. The high-side control circuit disables the first (low-resistance) pull-up driver switch when burst-mode operation is indicated at the mode indication input.

According to a method performed within a switched-mode power converter, the method is for controlling a power switch of the power converter so as to prevent excessive voltage levels across a synchronous rectification (SR) switch of the power converter. The power converter includes a switch driver configured as described above including, notably, first and second pull-up driver switches. The method comprises detecting that a load of the power converter is drawing power below a low-power threshold, e.g., that the load is in a standby mode. Responsive to such detecting, a burst mode of operation is entered and the first (low-resistance) pull-up driver switch is disabled.

According to an embodiment of an isolated power converter, the isolated power converter comprises an input, an output, a transformer, a power stage, an SR switch, and a controller. The input is for coupling to an input power source, whereas the output is for coupling to a load of the power converter. The transformer includes primary and secondary windings. The power stage is configured to switchably couple power from the input to the primary winding. The power stage includes a power switch and a switch driver for controlling the power switch. The switch driver is configured as described above and, notably, includes first and second pull-up driver switches, wherein the first pull-up driver switch is disabled responsive to the power converter entering a burst mode of operation (standby). The SR switch is configured to rectify power provided by the secondary winding such that DC power is provided to the output, and has an SR voltage across its terminals. The SR switch has an avalanche breakdown voltage level associated with the SR voltage. The controller is configured to control the transfer of power to the output by generating a switch control signal to drive the power stage. The controller also generates, responsive to detecting a low-power state, a burst-mode indication, which is used to disable the first pull-up driver switch, as described above. The low-power state is detected based upon a sensed current and/or a sensed voltage of the load.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments may be combined unless they exclude each other. Embodiments are depicted in the drawings and are detailed in the description that follows.

DETAILED DESCRIPTION

Figure 1:
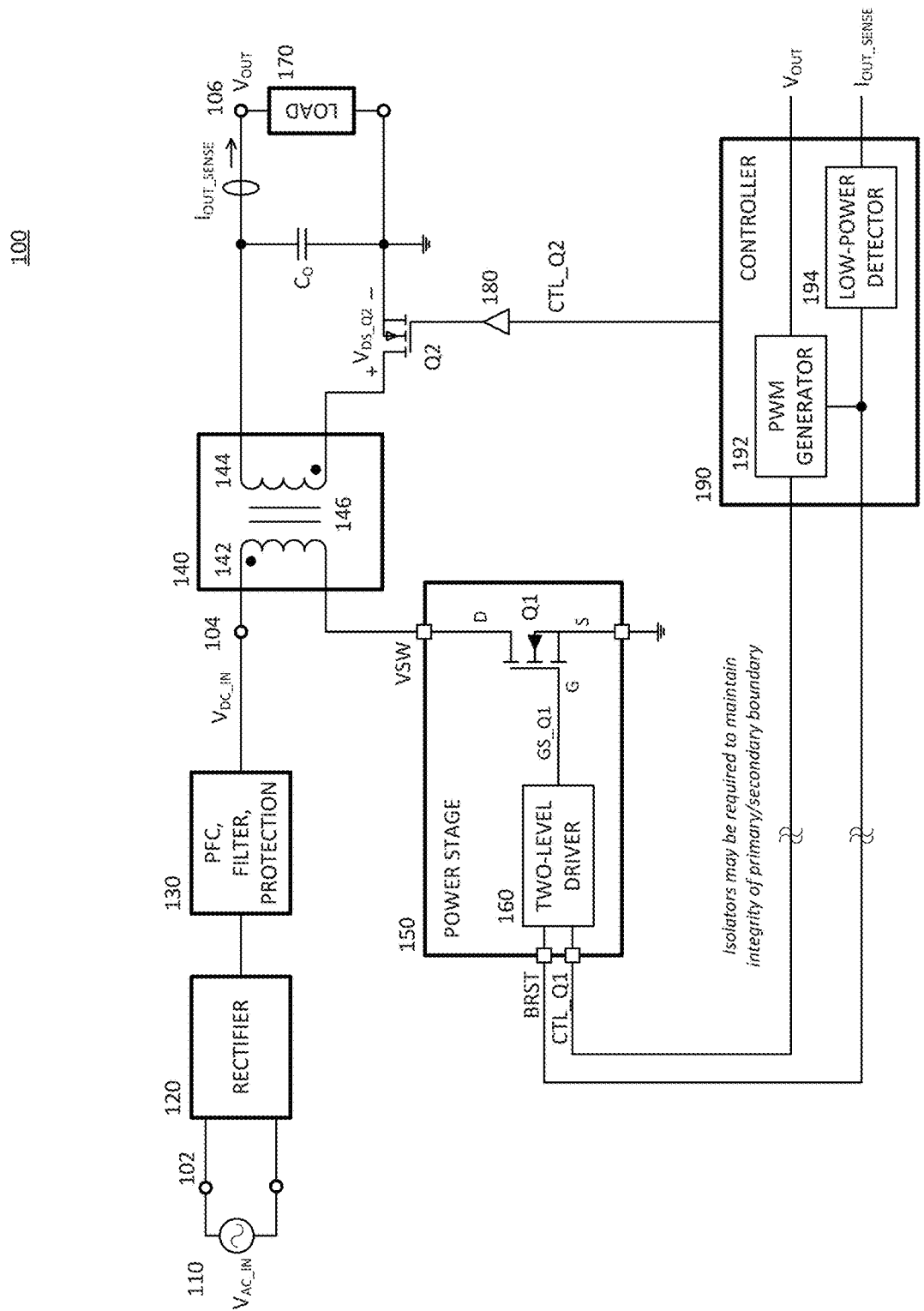
FIG. 1 illustrates a schematic diagram of an isolated switched-mode power converter.

The embodiments described herein provide techniques for switching a power switch within a switched-mode power converter. The techniques are primarily described in the context of an isolated power converter, in which the power switch is located on the primary side of the power converter, and a synchronous rectification (SR) switch is located on the secondary side of the power converter. These techniques use a two-level switch driver such that the power switch may be transitioned to its conducting mode at different rates. The switch driver includes a low-resistance and a high-resistance pull-up driver switch for sourcing current to the control terminal (e.g., gate) of the power switch. During normal operational mode of the power converter, both pull-up drivers are used so that the control terminal of the power switch may be charged as quickly as possible. This leads to fast switch transitioning and low switching losses, as the power switch spends little time in its triode region where power consumption of the power switch is highest. The fast switching leads to steep rising edges for voltage pulses that are provided across a primary winding of a transformer within the power converter. The resultant pulses on a secondary winding of the transformer also have steep rising edges. As explained in detail further below, only the high-resistance pull-up driver switch is used during burst-mode operation of the power converter. This reduces the slope of the rising edge of voltage pulses, and associated problems on the secondary side of the power converter.

The alternating current (AC) voltage provided by the secondary winding must be rectified so that direct current (DC) voltage is provided to a load of the power converter. Such rectification is provided by current-blocking devices, such as diodes or synchronous rectification (SR) switches. SR switches provide lower voltage drops than diodes and have lower associated power losses. Hence, SR switches are preferred in applications where power efficiency is important. The embodiments herein are described primarily in the context of power converters using an SR switch for rectification, but the described two-level switch driver exhibits similar benefits for power converters that use diodes for rectification.

The voltage pulses induced across the secondary winding lead to corresponding voltage pulses across conduction terminals of the SR switch, e.g., drain and source terminals of a metal-oxide semiconductor field-effect transistor (MOSFET). The rising edge of each voltage pulse leads to ringing in the voltage applied across the SR switch. During normal operational mode of the power converter, the current sunk by the load curtails the extremes of such voltage ringing. During standby operational modes, however, the load is not sinking any appreciable current meaning that the voltage across the SR switch oscillates to higher levels than during normal operational mode, if no mitigating techniques are used. An SR switch (or a diode) can only safely handle voltage levels below a certain threshold. Once the voltage across the SR switch reaches such a level, the SR switch enters an avalanche breakdown region. The voltage across the SR switch is constrained (clamped) by the switch's avalanche-breakdown voltage, and the current through the SR switch increases significantly once the SR voltage reaches this breakdown voltage.

An SR switch may tolerate a limited number of avalanche breakdowns. However, an isolated power converter operating in burst mode (standby) may lead to repetitive avalanche breakdown of its SR switch. The specification for an SR switch, such as a MOSFET, typically provides an avalanche breakdown voltage threshold and cautions against exceeding this threshold. An SR switch in avalanche breakdown incurs excessive current, and related excessive temperature, which damage the SR switch. Moreover, repetitive avalanche breakdown of a MOSFET leads to trapped charges within the MOSFET which changes the internal field distribution and, ultimately, leads to an inability of the MOSFET to block voltage. Regardless of the specific mechanism, avalanche breakdown, particularly repetitive avalanche breakdown, alters the MOSFET's switching properties thereby damaging and/or destroying the MOSFET. Repetitive avalanche breakdown must, therefore, be avoided.

One technique for avoiding avalanche breakdown of an SR switch is to connect a snubber circuit, such as a resistor-capacitor-diode (RCD) snubber, in parallel with the SR switch. The RCD snubber uses a serially-connected resistor and capacitor to dissipate energy trapped in the leakage inductance of the transformer. By redirecting the current flow associated with this energy away from the SR switch, the maximum voltage level incurred across the SR switch as a voltage pulse is applied is reduced, i.e., the extent of the voltage ringing is constrained. The current charges the capacitor, thereby storing the energy associated with the current that is directed away from the SR switch. The charge stored on the capacitor is returned to the circuit via a current flowing through the diode. In a typical topology, the energy stored on the capacitor is returned to an inductor of the secondary side, which may be an inductance of the secondary winding, so that this energy is not lost.

Even though the energy stored by the RCD snubber capacitor is mostly returned to the circuit, the RCD snubber incurs some power loss. Notably, the voltage drop across the RCD resistor leads to power loss when the SR voltage is being limited (i.e., current is flowing through the resistor and charging the capacitor), and the voltage drop across the RCD diode leads to power loss when energy is returned to the circuit from the RCD capacitor. These power losses are fairly small when the isolated power converter is operating in its burst mode. However, power losses of the RCD snubber may also be incurred during normal operational mode, and thus degrade the overall power efficiency of the isolated power converter. For this reason, as well as the extra circuit components required by an RCD snubber, the RCD snubber does not provide an ideal solution for avoiding avalanche breakdown.

Rather than using an RCD snubber to limit the voltage across an SR switch, the circuits herein reduce the slope of the rising edge of the voltage pulse across the SR switch. Such a reduced slope reduces the high-frequency components of the voltage ringing and leads to a maximum voltage across the SR switch that is much lower than the maximum voltage incurred otherwise. The reduced slope is only needed during standby (low-power) modes, when the load is not sinking appreciable current, e.g., when the isolated power converter is operating in burst mode.

The reduced rising slope for the secondary-side voltage pulse is created by slowing the rising edge of a corresponding voltage slope on the primary side. This, in turn, is accomplished by slowing the transition of the primary-side power switch from its off to its on state. For the example of a MOSFET power switch, its gate is charged more slowly such that the MOSFET spends more time in its triode region, rather than quickly transitioning from its 'off' (nonconducting) state to its saturated (fully on) state. The switch driver, which is driving the MOSFET gate, operates in a reduced-current mode when the power converter is in its burst mode of operation, so as to realize the slow gate charging. The two-level switch driver includes two pull-up driver switches. Only the high-resistance pull-up driver switch is enabled during burst mode of operation. During normal operational mode, both pull-up driver switches are enabled, so that the power switch may transition from its cutoff to its saturated state as quickly as possible.

The embodiments are described below primarily by way of particular examples of an isolated switched-mode power converter, a switch driver, and a method for controlling a power switch in an isolated switched-mode power converter. These examples have the common feature that they make use of a switch driver having two current sourcing levels, wherein the current sourcing level is based upon a burst-mode indication. The switch driver techniques may also be applied to non-isolated power converters.

It should be understood that the below examples are not meant to be limiting. Circuits and techniques that are well-known in the art are not described in detail, so as to avoid obscuring unique aspects of the invention. Features and aspects from the example embodiments may be combined or re-arranged, except where the context does not allow this.

The description provided below uses a flyback converter topology and uses an SR switch on the ground side of the secondary winding of the transformer. It should be appreciated that the invention could be used in variants of the flyback converter topology described herein, as well as other isolated switched-mode power converter topologies. For example, the primary side could use a half bridge, full bridge, or LLC power stage. On the secondary side, the SR switch could be connected between the other terminal of the secondary winding and the output terminal of the power converter. Other rectification topologies may also be used including, e.g., a center-tapped secondary winding with SR switches on each outer leg, a current doubler, or a full-wave rectifier bridge. In addition to using SR switches, topologies based upon diodes could be used instead. Diode-based rectification comes at the expense, typically, of increased power loss, but has the advantage of not requiring switch control, as does rectification based upon SR switches. Diodes often have avalanche breakdown modes, which should be avoided in the same way as described above for MOSFETs.

FIG. 1 illustrates an isolated switched-mode power converter 100 making use of a two-level switch driver 160 that limits a voltage $V_{DS\_Q2}$ across a synchronous rectification (SR) switch Q2 during burst-mode operation. The power converter 100 includes an AC input 102, a DC input 104, an output 106, a rectifier 120, a power factor correction (PFC) circuit 130, a transformer 140, a power stage 150, and a controller 190.

The AC input 102 is for connecting to an AC power supply 110, which supplies an AC voltage $V_{AC\_IN}$. (The AC power supply 110 is not part of the isolated power converter 100.) The rectifier 120 rectifies the AC voltage $V_{AC\_IN}$, providing a DC voltage at its output. The optional power factor correction (PFC) and protection circuit may provide several functions, including correcting the power factor of the power converter by boosting the DC voltage provided by the rectifier 120, providing protection against voltage spikes or other input anomalies, and filtering the input voltage. In some applications, the rectifier 120 and PFC 130 may be swapped in order, or may be integrated within a combined circuit. The PFC 130 outputs a DC voltage $V_{DC\_IN}$ that is appropriate for coupling to the transformer 140. The illustrated power converter 100 provides AC-to-DC conversion, but a DC-to-DC variant may be realized by omitting the rectifier 120 and PFC 130, and coupling the DC input 104 to a DC power supply, e.g., a battery or another power converter that provides DC power.

The transformer 140 includes a primary winding 142 having N1 turns, a secondary winding 144 having N2 turns, and a core 146. The transformer provides a voltage step-down (or step-up) according to the turns ratio N1:N2.

The secondary side of the isolated power converter 100 includes an output capacitor $C_O$, the SR switch Q2, and the output 106. The output capacitor $C_O$ filters the voltage pulses provided by the secondary winding 144 and the SR switch Q2, thereby providing a relatively constant voltage $V_{OUT}$ at the output 106. The output 106 is for connecting to a load 170, which is not actually part of the power converter 100. The SR switch Q2 switchably connects one side of the secondary winding 144 to ground, thereby rectifying the voltage $V_{OUT}$ provided at the output. The SR switch Q2 illustrated in FIG. 1 is an enhancement-mode metal-oxide-semiconductor field-effect transistor (MOSFET), but other switch types may be used. For example, junction field-effect transistors (JFETs), bipolar junction transistors (BJTs), insulated gate bipolar transistors (IGBTs), high electron mobility transistors (HEMTs), Gallium Nitride (GaN) MOSFETs, or other types of power transistors may be preferred in some applications. Note that most transistor types have a maximum allowed voltage, such as an avalanche breakdown voltage.

The controller 190 and its constituent parts may be implemented using a combination of analog hardware components (such as transistors, amplifiers, diodes, and resistors), and processor circuitry that includes primarily digital components. The processor circuitry may include one or more of a digital signal processor (DSP), a general-purpose processor, and an application-specific integrated circuit (ASIC). The controller 190 may also include memory, e.g., non-volatile memory such as flash, which includes instructions or data for use by the processor circuitry, and one or more timers. The controller 190 inputs sensor signals such as signals corresponding to the output voltage $V_{OUT}$ and a sensed output current $I_{OUT\_SENSE}$.

The controller 190 is responsible for controlling the power converter 100 so as to supply necessary power to the load 170. The controller 190 senses the output voltage $V_{OUT}$ and current $I_{OUT\_SENSE}$, and uses these measurements to generate control signals CTL_Q1, CTL_Q2 for controlling the primary-side power stage 150 and the secondary-side SR switch Q2. A rectifier controller within the controller 190 generates the control signal CTL_Q2 based upon a sensed current through the SR switch Q2, sensed secondary-side voltages such as the drain-to-source voltage $V_{DS-Q2}$, or timing from a pulse-width-modulation (PWM) generator 192. For ease of illustration, such a rectifier controller is not explicitly illustrated and, because such rectification techniques are well known in the art, further detail regarding the rectification control is not provided herein. The control signal CTL_Q2 is provided to a gate of the SR switch Q2, via a driver 180, thereby controlling conduction of the SR switch Q2.

The controller 190 includes the PWM generator 192 and a low-power detector 194. The PWM generator 192 typically includes a linear feedback controller, such as a proportional-integral-derivative (PID) controller, for regulating the output voltage $V_{OUT}$. During normal operational mode of the power converter 100, the PWM generator 192 senses the output voltage $V_{OUT}$ and compares this voltage against a reference (target) voltage $V_{TARGET}$ to determine control parameters for generating the control signal CTL_Q1 for the power stage 150. For example, the PWM generator 192 might generate control signals CTL_Q1 having a fixed switching frequency and variable duty cycle, in which case the determined control parameter is a duty cycle. Alternatively, the PWM generator 192 might generate control signals having fixed pulse widths and variable frequencies, in which case the control parameter is a switching frequency. These and other techniques are well known within the field of feedback control and are not crucial for understanding the unique aspects of the power switch control described herein. Hence, further detail regarding feedback control techniques is not provided.

The low-power detector 194 determines whether the power converter 100 should operate in a normal or a burst mode. The low-power detector 194 may detect that the load 170 is inactive by comparing the sensed current $I_{OUT\_SENSE}$ against a low-power current threshold. The output current $I_{OUT\_SENSE}$ may be sensed using a shunt resistor, a current transformer, the DC resistance (DCR) of an inductance associated with the secondary winding 144, or other current-sensing techniques. Because such current-sensing techniques are well known in the art, they are not described in further detail herein.

Techniques other than direct sensing of the secondary-side current IOUT_SENSE may also be used. For example, a primary-side current flowing through the primary winding 142 and the power switch Q1 may be measured and used to sense that the load 170 is inactive. Sensing of a primary-side current may be preferred in some applications including, e.g., when a controller is located on the primary side rather than the secondary side of the power converter 190 and/or when current-mode control is used for the power switch Q1. Sensing of a primary-side current may use similar techniques as described previously for measuring the output current IOUT_SENSE, e.g., measuring the voltage across a shunt resistor connecting the source of the power transistor Q1 to ground, measuring the drain-to-source voltage of the power transistor Q1, etc. For ease of illustration, sensing of the output current IOUT_SENSE via measurement of a primary-side current is not shown in FIG. 1.

The low-power detector 194 indicates, via a burst-mode indicator BRST, that the power converter 100 should enter a burst mode of operation responsive to detecting that the load 170 is inactive, e.g., in a low-power state. Such inactivity may be determined, e.g., by detecting that the output current $I_{OUT\_SENSE}$ is below the low-power current threshold or, similarly, that a primary-side current is below a corresponding primary-side low-power current threshold. While in burst-mode operation, the PWM generator 192 ceases generation of control signals CTL_Q1 for the power stage 150 for large intervals of time. Rather than precisely regulating the output voltage to match the target voltage $V_{TARGET}$, the PWM generator 192 typically uses relaxed output voltage limits during burst mode. For example, the PWM generator 192 disables generation of the control signal CTL_Q1 until the output voltage falls to a burst-mode lower limit $V_{LOW\_STBY}$, which is lower than the normal-mode target voltage $V_{TARGET}$. For a target voltage $V_{TARGET}$=20V, the standby voltage may be allowed to fall as low as $V_{LOW\_STBY}$=19.5V. The PWM generator 192 then enables generation of the switch control signal CTL_Q1 until the output voltage $V_{OUT}$ reaches the target voltage $V_{TARGET}$=20V, or an upper limit $V_{HIGH\_STBY}$ which is slightly higher than the target voltage $V_{TARGET}$=20V, e.g., 20.5V. The net effect is that the PWM generator 192, during burst-mode operation, provides bursts of pulses on the control signal CTL_Q1, separated by long intervals of inactivity.

While the above is described in the context of a flyback converter 100 having a power stage 150 with one power switch, it should be appreciated that isolated power converters having other topologies may have additional power switches and that the PWM generator 192 would generate control signals corresponding to such additional power switches.

The controller 190 may be located on the primary or secondary side of the power converter 100. So as to maintain the integrity of the primary-to-secondary boundary, signals input or output from the controller 190 may need to pass through isolators, which are not shown for ease of illustration. For example, a controller 190 located on the secondary side would require that the output signals CTL_Q1, BRST provided to the (primary-side) power stage 150 be passed through isolators. Conversely, a primary-side controller would require that the other input and output signals to the controller 190 be passed through isolators.

The power stage 150 includes a power switch Q1 and a two-level switch driver 160. The power switch Q1 switchably connects one terminal, corresponding to the illustrated node VSW, of the primary winding 142 to ground, thereby generating voltage pulses across the primary winding 142. The illustrated power switch Q1 is a MOSFET having gate, drain and source terminals. In some applications, other switch types may be preferred such as junction field-effect transistors (JFETs), bipolar junction transistors (BJTs), insulated gate bipolar transistors (IGBTs), Gallium Nitride (GaN) MOSFETs or high electron mobility transistors (HEMTs). The gate of the power switch Q1 is charged at different rates by the two-level switch driver 160, according to the burst-mode indication BRST input to the power stage 150. When burst-mode operation is indicated, the switch driver 160 disables at least some of its sourcing current, so that the gate of the power switch Q1 is charged more slowly.

Figure 2:
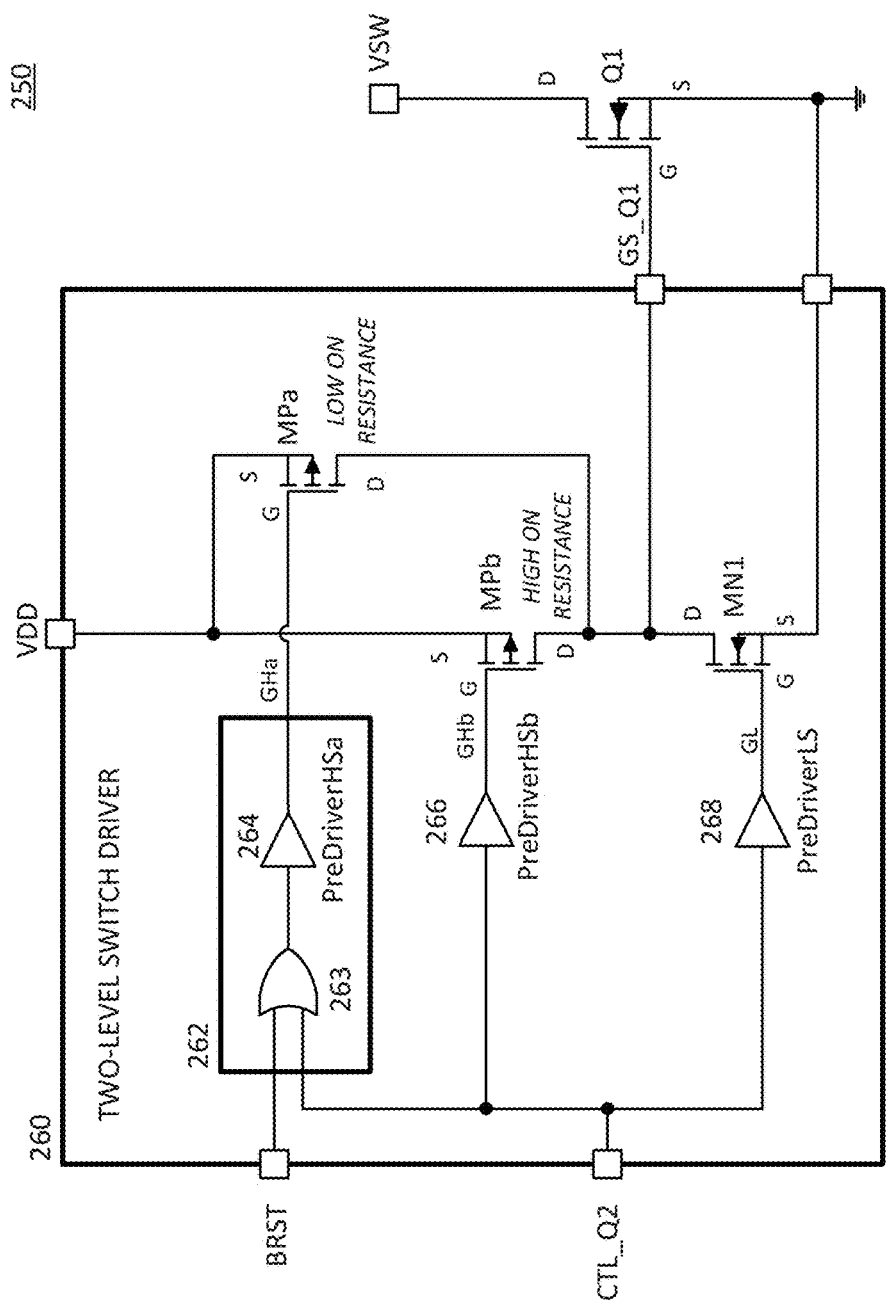
FIG. 2 illustrates a schematic diagram of a two-level switch driver, as used in the isolated power converter of FIG. 1.

FIG. 2 illustrates a particular embodiment for a power stage 250, including a two-level switch driver 260, in further detail. The switch driver 260 provides a gate signal GS_Q1 to the gate (G) of the power switch Q1, by sourcing or sinking current to the gate via a push-pull arrangement of driver switches. The switch driver 260 includes pull-up driver switches MPa, MPb and a pull-down driver switch MN1. Pre-drivers 264, 266, 268 provide gate signals GHa, GHb, GL for each of the driver switches MPa, MPb, MN1. The pull-down driver switch MN1 is an n-channel MOSFET, meaning that this switch is set to conduct when a high voltage is provided to its gate. The pull-up driver switches MPa, MPb are p-channel MOSFETs, meaning that they are set to conduct when a low voltage, e.g., 0V, is provided to their respective gates. The first pull-up driver switch MPa has a low on-state resistance $R_{DS\_ON}$, whereas the second pull-up driver switch MPb has a high on-state resistance.

The first pull-up driver switch MPa is controlled by a gate signal GHa output from a high-side control circuit 262. The high-side control circuit 262 effectively disables the first pull-up driver switch MPa when burst-mode operation is indicated. The high-side control circuit 262 includes an OR gate 263 and a first high-side pre-driver 264. During normal operation, the burst-mode indication BRST is low and the OR gate 263 passes the control signal CTL_Q2 through to the first high-side pre-driver 264. In this state, the first and second pull-up driver switches are switched simultaneously according to the control signal CTL_Q2. More particularly, a high voltage (VDD) for the control signal CTL_Q2 is passed through to the gate terminals of the pull-up driver switches MPa, MPb, such that their gate-to-source voltages VGS_MPa, VGS_MPb are zero and the switches are turned off. Conversely, a low voltage (0V) for the control signal CTL_Q2 is passed through to the gate terminals of the pull-up driver switches MPa, MPb, such that their gate-to-source voltages VGS_MPa, VGS_MPb are (−VDD) and the switches are turned on.

During burst-mode operation, the burst-mode indication BRST is high and the output of the OR gate 263 stays high regardless of the state of the control signal CTRL_Q2. The first pull-up driver switch MPa remains off, as its gate-to-source voltage $V_{GS\_MPa}$=0V in this state. The second pull-up driver switch MPb is controlled by the control signal CTRL_Q2, and has no dependence on the burst-mode indication BRST.

The low-side driver switch MN1 is turned on when the control signal CTL_Q2 is high (logical "1"), and turns off when this signal is low (0V). When turned on, the low-side driver switch MN1 sinks current from the gate of the power switch Q1, thereby turning the power switch Q1 off.

The first pull-up driver switch MPa has a low on-state resistance, e.g., $R_{MPa\_DS\_ON}$=5 S2, whereas the second pull-up driver switch MPb has a relatively high on-state resistance, e.g., $R_{MPa\_DS\_ON}$=600Ω. The current-sourcing ability of the pull-up driver stage is determined by its on-state resistance. During burst mode, only the second (high resistance) pull-up driver switch is enabled, meaning that the current sourcing ability is considerably reduced relative to normal operation. With a lower sourcing current provided to the gate of the power switch Q1, the power switch Q1 turns on more slowly and the voltage pulse generated across the primary winding 142 has a low slew rate.

The on-state resistance of a switch, including the pull-up driver switches MPa, MPb, is typically determined by its size, e.g., channel length and width. In one embodiment, the channel widths of the first and second pull-up driver switches MPa, MPb may be set to achieve a desired ratio of the on-state resistances or, similarly, an absolute desired on-state resistance of the second pull-up driver switch MPb that leads to a desired voltage slew rate across a secondary-side SR switch such as Q2 in FIG. 1. In another embodiment, the pull-up driver switches MPa, MPb may be portions of the same device, but have separate control terminals. For example, a MOSFET may have multiple source and drain regions connected in parallel, wherein a gate finger is provided to control each source/drain region. Multiple gate fingers may be tied together, to effectively create a larger MOSFET having lower on-state resistance than a single source/drain portion of the MOSFET. The gate fingers may be partitioned into one group allocated to the first pull-up driver switch MPa, and another group allocated to the second pull-up driver switch MPb. For example, a MOSFET having 120 gate fingers may be characterized in that each drain/source pair may has an effective on-state resistance of 600Ω. One such finger may be allocated to control one drain/source pair making up the second (high-resistance) pull-up driver switch MPb. The remaining 119 fingers may be allocated to control the remaining 119 drain/source pairs which make up the first (low-resistance) pull-up driver switch MPa. The allocation of gate fingers between the first and second pull-up driver switches MPa may be done during fabrication via a metal mask, or be otherwise programmable, e.g., using a digital code to allocate MOSFET sections between the first and second pull-up driver switches. The pre-drivers 264, 266 for the first and second pull-up driver switches MPa, MPb must be sized according to the size of the pull-up driver switches MPa, MPb, e.g., the number of sections allocated. Furthermore, the overall pull-up driver strength, characterized by the combined on resistance of the pull-up driver switches MPa, MPb in parallel, must be sized to provide the source current required by the gate of the power switch Q1 during normal operation of the power converter 100.

Figure 3:
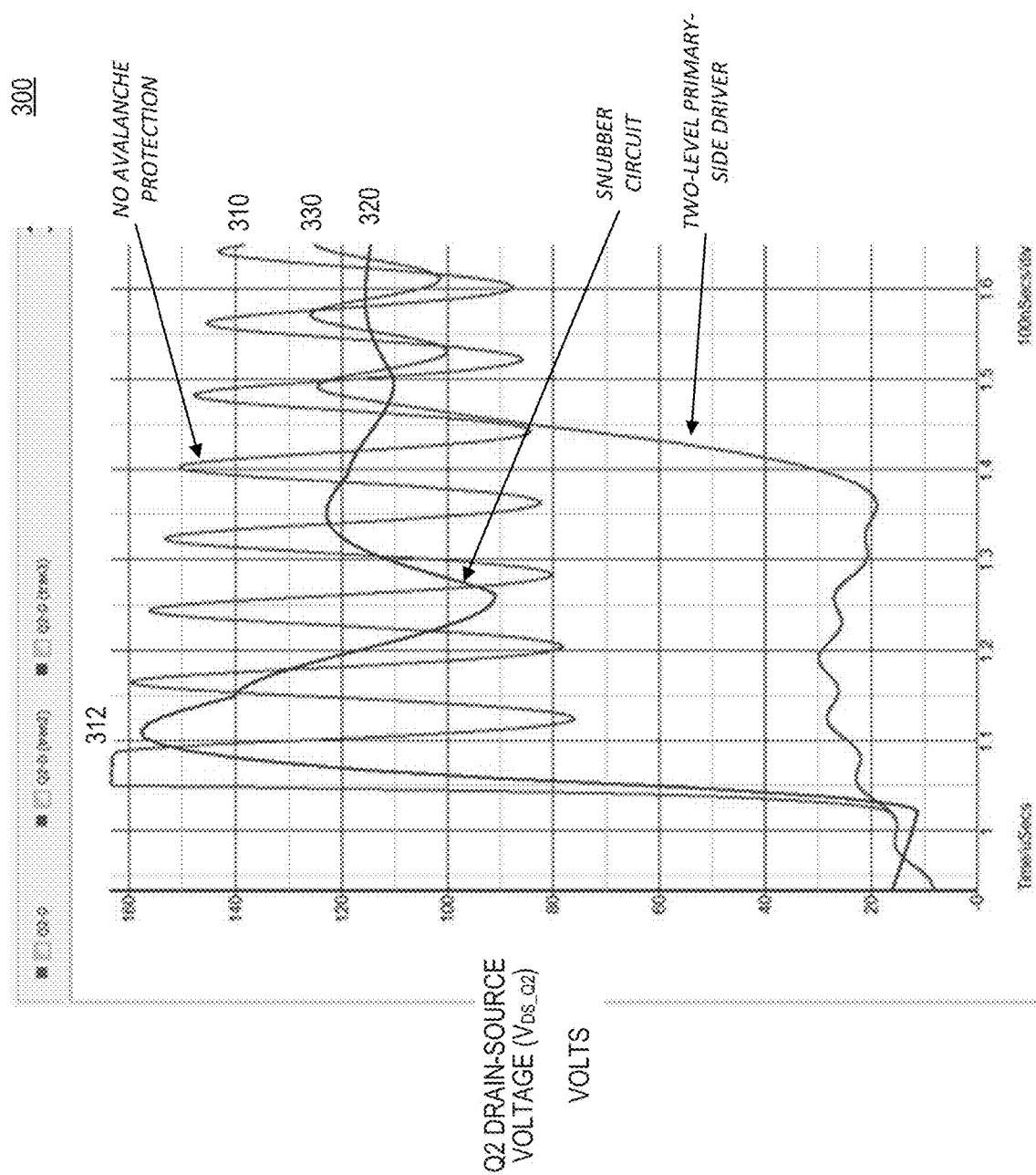
FIG. 3 illustrates waveforms corresponding to a voltage across a secondary-side synchronous rectification (SR) switch, such as the SR switch in the isolated power converter of FIG. 1, during burst-mode operation for different power converter circuits.

FIG. 3 illustrates waveforms 300 corresponding to the drain-to-source voltage $V_{DS\_Q2}$ across the SR switch Q2 for different power converter circuits. These waveforms 300 are initiated by voltage pulses applied across a primary-side winding using a primary-side power switch such as Q1 within FIG. 1, wherein the voltage pulses induce secondary-side voltage pulses leading to the drain-to-source voltage waveforms 300 illustrated. These waveforms are generated during a low-power (standby) mode, during which there is negligible current drawn by a load of the respective power converters.

A first waveform 310 corresponds to a first power converter in which no mitigation is provided for the steep rising edge of the voltage pulse. The voltage attempts to ring to a high voltage, but the SR switch clamps 312 the voltage at an avalanche breakdown voltage of approximately 165V. During the avalanche breakdown period, the SR switch conducts excessive current levels and the SR switch is potentially damaged, particularly when the avalanche breakdown occurs repetitively.

A second waveform 320 corresponds to a second power converter in which a snubber circuit, such as the RCD snubber described previously, limits the maximum voltage across the SR switch. The peak voltage of this second waveform only reaches about 158 V, meaning that avalanche breakdown of the SR switch is avoided.

The third waveform 330 corresponds to a third power converter, which includes a two-level switch driver as illustrated in FIG. 2. The drain-to-source voltage of the SR switch rises more slowly than either the first or the second waveforms 310, 320. Avalanche breakdown of the SR switch is avoided, without the necessity of an RCD circuit and its components. Furthermore, the maximum voltage of approximately 125V across the SR switch is significantly lower than in the power converters having no protection or having an RCD snubber.

Figure 4:
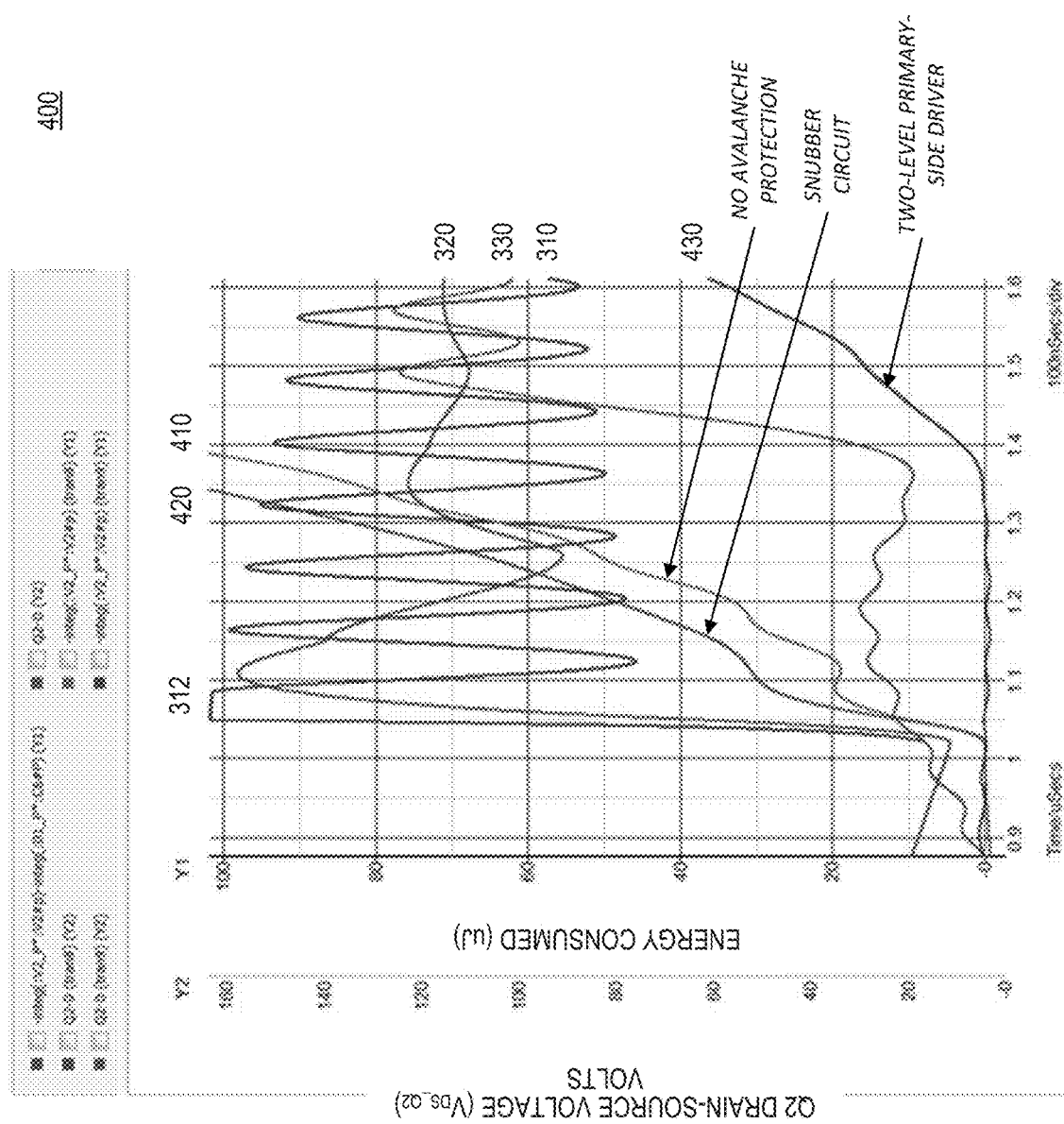
FIG. 4 illustrates waveforms corresponding to energy consumption during burst-mode operation for different power converter circuits.

FIG. 4 illustrates waveforms 400 corresponding to energy consumed from an input power source for the power converter circuits described in relation to FIG. 3. The first energy waveform 410 corresponds to the consumed energy for the first power converter, in which no mitigation for the steep rising voltage pulse is provided. The second energy waveform 420 corresponds to the energy consumed for the second power converter, in which a snubber circuit is used to avoid avalanche breakdown in the SR switch. Note that more energy is consumed for this power converter, due to the energy consumption of the snubber. The third energy waveform 430 corresponds to the energy consumed for the third power converter, in which a two-level switch driver, such as the switch driver 260 of FIG. 2, is used for switching a primary-side power stage. It can be seen that the energy consumption incurred by the third power converter, making use of a two-level switch driver, is much lower than the other illustrated alternatives.

Figure 5:
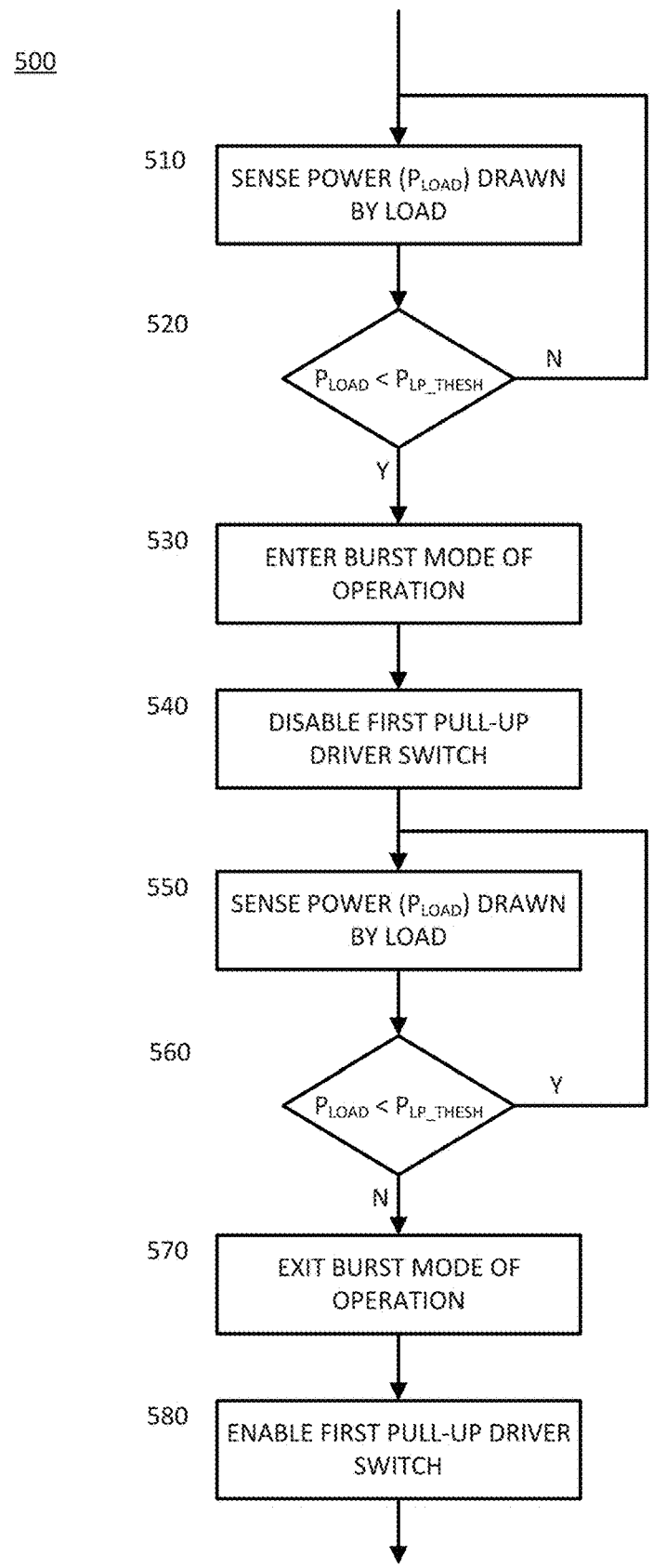
FIG. 5 illustrates a method for controlling a primary-side power switch so as to prevent excessive voltage levels across a secondary-side SR switch by using a two-level switch driver.

FIG. 5 illustrates a method 500 for controlling a primary-side power switch within an isolated power converter, so as to prevent excessive voltage levels across a secondary-side SR switch. The method 500 may be implemented within an isolated power converter, such as the one illustrated in FIG. 1. The method 500 begins by sensing 510 the power $P_{LOAD}$ drawn by a load of the power converter, and comparing 520 this power $P_{LOAD}$ against a low-power threshold $P_{LP\_THRESH}$. (In a substantively equivalent technique, a load current, e.g., $I_{OUT\_SENSE}$ in FIG. 1, may be sensed and compared against a low-power current threshold $I_{LP\_THRESH}$.) Once the drawn power $P_{LOAD}$ drops below the low-power threshold $P_{LP\_THRESH}$, the power converter enters 530 a burst mode of operation, and a first (low-resistance) pull-up driver switch is disabled. The burst-mode operation continues until the power $P_{LOAD}$ drawn by the load exceeds the low-power threshold $P_{LP\_THRESH}$, as indicated by sensing 550 the drawn power $P_{LOAD}$. Once the load begins drawing power above 560 the threshold $P_{LP\_THRESH}$, burst-mode operation is exited 570 and normal operation resumes. The first (low-resistance) pull-up driver switch is enabled 580.

The two-level switch driver and control of a power switch is described above in the context of an isolated switched-mode power converter. These techniques and circuits may also be applied to power converter topologies that do not provide isolation. For example, a non-isolated buck-boost power converter uses an inductor to temporarily store energy rather than using a transformer to transfer energy across an isolation barrier. In a typical buck-boost converter, a power switch switchably connects an input power source to the energy-storage inductor, thereby generating an AC voltage across the inductor. The AC voltage is rectified, e.g., using an SR switch, and the resultant DC voltage is provided to a load of the power converter. As in the isolated power converter described above, the SR switch in such a buck-boost converter may be subject to excessive voltages, including an avalanche breakdown voltage limit, during periods when the load is inactive and not drawing significant current. The two-level switch driver described previously and illustrated in FIG. 2 may be similarly used in such a non-isolated buck-boost power converter. More particularly, the two-level switch driver may drive the power switch that couples the input power source to the energy storage inductor. During periods when the load is drawing low power and particularly when such a state causes burst-mode operation, the two-level driver is placed in a state where only its high-resistance pull-up driver is enabled, as described previously. This may be accomplished by providing a burst-mode indication, e.g., the BRST signal in FIG. 2, to the two-level switch driver. By using only the high-resistance pull-up driver during burst-mode operation, the voltage pulses provided to the energy-storage inductor have lower rising edges, and the extent of any voltage ringing across the SR switch is thereby reduced.

According to an embodiment of a switch driver, the switch driver is configured to control a power switch located in a switched-mode power converter, so as to prevent excessive voltage levels across a synchronous rectification (SR) switch of the power converter. The switch driver comprises a pull-down driver switch, two pull-up driver switches, a mode indication input, a switch control input, and a high-side control circuit. The pull-down driver switch sinks current from a control terminal of the power switch. The pull-up driver switches source current to the control terminal. A first of the pull-up switches has a first on-state resistance, and a second has a second on-state resistance, wherein the second on-state resistance is substantially higher than the first on-state resistance. The mode indication input indicates whether the power converter is operating in a burst mode or not. The switch control input controls the conductivity of the pull-down driver switch, the second (high resistance) pull-up driver switch and, in conjunction with the mode indication input, the first pull-up driver switch. The high-side control circuit disables the first (low resistance) pull-up driver switch when burst-mode operation is indicated at the mode indication input.

According to any embodiment of the switch driver, the pull-down driver switch is an n-channel metal-oxide semiconductor field-effect transistor (MOSFET), and the first and second pull-up driver switches are p-channel MOSFETs.

According to any embodiment of the switch driver, the high-side control circuit comprises a high-side pre-driver and an inclusive OR gate. The high-side pre-driver is coupled to and controls conductivity of the first pull-up driver switch. The inclusive OR gate inputs the mode indication and the switch control signal, and outputs a high-side switch control signal to the high-side pre-driver.

According to any embodiment of the switch driver, the second pull-up driver switch is sized so as to source a current level that limits the voltage levels across the SR switch to be lower than an upper voltage limit of the SR switch, the upper voltage limit corresponding to an avalanche breakdown voltage of the SR switch.

According to any embodiment of the switch driver, the first pull-up driver switch, when turned on, sources a current level at least 100 times a current level sourced by the second pull-up driver switch, when the second pull-up driver switch is turned on.

According to any embodiment of the switch driver, a size ratio between the first and second pull-up driver switches is programmable by a configurable digital code.

According to any embodiment of the switch driver, a size ratio between the first and second pull-up driver switches is set by a metal option during fabrication of the pull-up driver switches.

According to a method performed in a switched-mode power converter, the method is for controlling a power switch of the power converter so as to prevent excessive voltage levels across a synchronous rectification (SR) switch of the power converter. The power converter includes a switch driver configured as described above including, notably, first and second pull-up driver switches. The method comprises detecting that a load of the power converter is drawing power below a low-power threshold, e.g., that the load is in a standby mode. Responsive to such detecting, a burst mode of operation is entered and the first pull-up driver switch is disabled.

According to any embodiment of the method, the SR switch has an associated avalanche breakdown voltage corresponding to a voltage limit across first and second terminals of the SR switch, and the on-state resistance of the second pull-up driver switch is configured to support a current level through the second pull-up driver switch such that a rate at which the power switch turns on ensures that the voltage across the first and second terminals of the SR switch stays below the avalanche breakdown voltage of the SR switch.

According to any embodiment of the method, the method also comprises exiting the burst mode of operation and enabling the first pull-up driver switch, responsive to detecting that the load of the power converter is drawing more than the low power level.

According to an embodiment of an isolated power converter, the isolated power converter comprises an input, an output, a transformer, a power stage, an SR switch, and a controller. The input is for coupling to an input power source, whereas the output is for coupling to a load of the power converter. The transformer includes primary and secondary windings. The power stage is configured to switch power from the input to the primary winding. The power stage includes a power switch and a switch driver for controlling the power switch. The switch driver is configured as described above and, notably, includes first and second pull-up driver switches, wherein the first pull-up driver switch is disabled responsive to the power converter entering a burst mode of operation (standby). The SR switch is configured to rectify power provided by the secondary winding such that DC power is provided to the output, and has an SR voltage across its terminals. The SR switch has an avalanche breakdown voltage level associated with the SR voltage. The controller is configured to control the power transferred to the output by generating a switch control signal to drive the power stage. The controller also generates, responsive to detecting a low-power state, a burst-mode indication, which is used to disable the first pull-up driver switch. The low-power state is detected based upon a sensed current and/or a sensed voltage of the load.

According to any embodiment of the isolated power converter, the pull-down driver switch is an n-channel metal-oxide semiconductor field-effect transistor (MOSFET), and the first and second pull-up driver switches are p-channel MOSFETs.

According to any embodiment of the isolated power converter, the high-side control circuit comprises a high-side pre-driver and an inclusive OR gate. The high-side pre-driver is coupled to and controls conductivity of the first pull-up driver switch. The inclusive OR gate inputs the mode indication and the switch control signal, and outputs a high-side switch control signal to the high-side pre-driver.

According to any embodiment of the isolated power converter, the second pull-up driver switch is sized so as to source a current level that limits the voltage levels across the SR switch of the secondary side to be lower than an upper voltage limit of the SR switch, the upper voltage limit corresponding to an avalanche breakdown voltage of the SR switch.

According to any embodiment of the isolated power converter, the first pull-up driver switch, when turned on, sources a current level at least 100 times a current level sourced by the second pull-up driver switch, when the second pull-up driver switch is turned on.

According to any embodiment of the isolated power converter, a size ratio between the first and second pull-up driver switches is programmable by a configurable digital code.

According to any embodiment of the isolated power converter, a size ratio between the first and second pull-up driver switches is set by a metal option during fabrication of the pull-up driver switches.

According to any embodiment of the isolated power converter, the isolated power converter has a flyback converter topology.

As used herein, the terms "having," "containing," "including," "comprising," and the like are open-ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A switch driver for controlling a power switch in a switched-mode power converter, so as to prevent excessive voltage levels across a synchronous rectification (SR) switch of the power converter, the switch driver comprising:
   a pull-down driver switch for sinking current from a control terminal of the power switch;

a first pull-up driver switch for sourcing current to the control terminal, the first pull-up driver switch having a first on-state resistance;

a second pull-up driver switch for sourcing current to the control terminal, the second pull-up driver switch having a second on-state resistance substantially higher than the first on-state resistance;

a mode indication input;

a switch control input, which controls the pull-down driver switch, the first pull-up driver switch, and the second pull-up driver switch; and a high-side control circuit configured to disable the first pull-up driver switch responsive to a burst-mode indication at the mode indication input, wherein the first and second pull-up driver switches are coupled to a same driver power supply having a same driver sourcing voltage, such that the same driver sourcing voltage is applied to the control terminal responsive to the first and/or the second pull-up driver switches being turned on.

2. The switch driver of claim 1, wherein the pull-down driver switch is an n-channel metal-oxide semiconductor field-effect transistor (MOSFET), and the first and second pull-up driver switches are p-channel MOSFETs.

3. The switch driver of claim 2, wherein the high-side control circuit comprises:

a high-side pre-driver for controlling the first pull-up driver switch;

an inclusive OR gate having the mode indication and the switch control as its inputs, and having an output coupled to an input of the high-side pre-driver.

4. The switch driver of claim 1, wherein the second pull-up driver switch is sized so as to source a current level that limits the voltage levels across the SR switch to be lower than an upper voltage limit of the SR switch, the upper voltage limit corresponding to an avalanche breakdown voltage of the SR switch.

5. The switch driver of claim 1, wherein the first pull-up driver switch, when turned on, sources a current level at least 100 times a current level sourced by the second pull-up driver switch, when the second pull-up driver switch is turned on.

6. The switch driver of claim 1, wherein a size ratio between the first and second pull-up driver switches is programmable by a configurable digital code.

7. The switch driver of claim 1, wherein a size ratio between the first and second pull-up driver switches is set by a metal option during fabrication of the pull-up driver switches.

8. The switch driver of claim 1, wherein the high-side control circuit comprises:

a high-side pre-driver for controlling the first pull-up driver switch; and high-side logic circuitry having the mode indication and the switch control as inputs, and configured to disable the high-side pre-driver based upon the mode indication, wherein the second pull-up driver switch is not disabled based upon the mode indication.

9. A method for controlling a power switch in a switched-mode power converter so as to prevent excessive voltage levels across a synchronous rectification (SR) switch of the power converter, the power converter including a switch driver comprising first and second pull-up driver switches wherein the second pull-up driver switch has an on-state resistance substantially higher than an on-state resistance of the first pull-up driver switch, the method comprising;

detecting that a load of the power converter is drawing a low power level; responsive to the detecting, entering a burst mode of operation and disabling the first pull-up driver switch; and coupling the first and second pull-up driver switches to a same driver power supply having a same driver sourcing voltage, such that the same driver sourcing voltage is applied to a control terminal of the power switch responsive to the first and/or the second pull-up driver switches being turned on.

10. The method of claim 9, wherein the SR switch has an associated avalanche breakdown voltage corresponding to a voltage limit across first and second terminals of the SR switch, and wherein the on-state resistance of the second pull-up driver switch is configured to support a current level through the second pull-up driver switch such that a rate at which the power switch turns on ensures that the voltage across the first and second terminals of the SR switch stays below the avalanche breakdown voltage of the SR switch.

11. The method of claim 9, further comprising:

responsive to detecting that the load of the power converter is drawing more than the low power level, exiting the burst mode of operation and enabling the first pull-up driver switch.

12. An isolated power converter, comprising:

an input for coupling to an input power source;

an output for coupling to a load;

a transformer comprising a primary winding and a secondary winding;

a power stage configured to switch power from the input to the primary winding, the power stage comprising a power switch and a switch driver for controlling the power switch;

a synchronous rectification (SR) switch configured to rectify power provided by the secondary winding, the SR switch having an SR voltage across first and second terminals of the SR switch and having an avalanche breakdown voltage level associated with the SR voltage;

a controller configured to control a power transfer to the output by generating a switch control signal, and to generate a burst-mode indication upon detecting that the load is in a low-power state;

wherein the switch driver comprises:

a pull-down driver switch for sinking current from a control terminal of the power switch;

first and second pull-up driver switches for sourcing current to the control terminal, wherein the second pull-up driver switch has an on-state resistance substantially higher than an on-state resistance of the first pull-up driver switch;

a switch control input for coupling to the switch control signal; and a high-side control circuit configured to disable the first pull-up driver switch responsive to the burst-mode indication.

13. The isolated power converter of claim 12, wherein the pull-down driver switch is an n-channel metal-oxide semiconductor field-effect transistor (MOSFET), and the first and second pull-up driver switches are p-channel MOSFETs.

14. The isolated power converter of claim 13, wherein the high-side control circuit comprises:

a first high-side pre-driver for controlling the first pull-up driver switch;

an inclusive OR gate having the mode indication and switch control as its inputs, and having an output coupled to an input of the first high-side pre-driver.

15. The isolated power converter of claim 12, wherein the second pull-up driver switch is sized so as to source a current level that limits the voltage level across the first and second terminals of the SR switch to be lower than an upper voltage limit of the SR switch, the upper voltage limit corresponding to the avalanche breakdown voltage of the SR switch.

16. The isolated power converter of claim 12, wherein the first pull-up driver switch, when turned on, sources a current level at least 100 times a current level sourced by the second pull-up driver switch, when the second pull-up driver switch is turned on.

17. The isolated power converter of claim 12, wherein a size ratio between the first and second pull-up driver switches is programmable by a configurable digital code.

18. The isolated power converter of claim 12, wherein a size ratio between the first and second pull-up driver switches is set by a metal option during fabrication of the pull-up driver switches.

19. The isolated power converter of claim 12, wherein the isolated power converter has a flyback converter topology.

20. A switch driver for controlling a power switch in a switched-mode power converter, so as to prevent excessive voltage levels across a synchronous rectification (SR) switch of the power converter, the switch driver comprising:
   a pull-down driver switch for sinking current from a control terminal of the power switch;
   a first pull-up driver switch for sourcing current to the control terminal, the first pull-up driver switch having a first on-state resistance;
   a second pull-up driver switch for sourcing current to the control terminal, the second pull-up driver switch having a second on-state resistance substantially higher than the first on-state resistance;
   a mode indication input;
   a switch control input, which controls the pull-down driver switch, the first pull-up driver switch, and the second pull-up driver switch; and
   a high-side control circuit configured to disable the first pull-up driver switch responsive to a burst-mode indication at the mode indication input,
   wherein the high-side control circuit comprises:
      a high-side pre-driver for controlling the first pull-up driver switch; and
      high-side logic circuitry having the mode indication and the switch control as inputs, and configured to disable the high-side pre-driver based upon the mode indication,
   wherein the second pull-up driver switch is not disabled based upon the mode indication.

* * * * *